United States Patent [19]
Raymond, Jr.

[11] 3,955,181
[45] May 4, 1976

[54] SELF-REFRESHING RANDOM ACCESS MEMORY CELL

[75] Inventor: Joseph H. Raymond, Jr., Houston, Tex.

[73] Assignee: Texas Instruments Incorporated, Dallas, Tex.

[22] Filed: Nov. 19, 1974

[21] Appl. No.: 525,245

[52] U.S. Cl. .................. 340/173 DR; 340/173 CA; 307/238
[51] Int. Cl.² .................... G11C 11/24; G11C 7/00
[58] Field of Search ............... 340/173 CA, 173 DR, 340/173 R; 307/238

[56] References Cited
UNITED STATES PATENTS

| | | |
|---|---|---|
| 3,576,571 | 4/1971 | Booher .................. 340/173 CA |
| 3,796,998 | 3/1974 | Appelt .................. 340/173 CA |
| 3,876,993 | 4/1975 | Cavanaugh ............ 340/173 CA |

Primary Examiner—Stuart N. Hecker
Attorney, Agent, or Firm—Harold Levine; Edward J. Connors, Jr.; John G. Graham

[57] ABSTRACT

A memory cell comprising field effect transistors for use in a random access memory array. The cell is of the dynamic type wherein data is stored on capacitive elements, and is self-refreshing; no circuitry external to the array is needed for refresh, other than clock sources. Five MOS field effect transistors are employed, with two non-overlapping clocks, a data buss for each row of the array and one address line for each column. The transistors and associated capacitors are arranged to reinforce a stored "1" or "0".

23 Claims, 8 Drawing Figures

SELF-REFRESHING RANDOM ACCESS MEMORY CELL

BACKGROUND OF THE INVENTION

This invention relates to memory cells of the type used in random access memory devices implemented in largescale-integrated semiconductor circuits.

Complex integrated circuits made for use in calculators or other data processing systems, or computer main frame memory arrays, employ MOS memory cells which have been of several types. Static cells or flip-flop circuits have been generally avoided, because of the excessive space needed for each cell. Dynamic cells using a capacitor as the storage mechanism are widely used. A common example is the "three transistor cell" type as shown in U.S. Pat. No. 3,585,613 or in U.S. Pat. No. 3,893,088, issued July 1, 1975, assigned to Texas Instruments Incorporated. The three transistor cell has found great utility; one disadvantage, however, is that it must be refreshed periodically. The voltage on the storage capacitance decays after a certain period, and so the data stored must be read out and written back in to make sure that data are not lost. The need for refresh imposes requirements for programming, sense circuitry and feed back amplifier circuitry. One transistor cells of the type set forth in U.S. Pat. No. 3,909,631 issued Sept. 30, 1975 and assigned to Texas Instruments Incorporated, have the same requirement for refresh, circuitry for this purpose is shown in U.S. Pat. No. 3,737,879. In attempts to eliminate the need for refresh in random access memory or RAM cells, various types of "self-refreshing" cells have been proposed. An example of such cells is shown in Digest of Technical Papers, 1972 IEEE International Solid State Circuits Conference, pages 14–15, by T. R. Walther and M. R. McCoy. The so-called invisible refresh cell provides an apparently static (refresh without addressing) operation in a dynamic-sized cell. Another example is described in copending U.S. patent application Ser. No. 454,349, filed Mar. 25, 1974 by Marion E. Cavanaugh, now U.S. Pat. No. 3,876,993, issued Apr. 8, 1975 assigned to Texas Instruments Incorporated. However, there are objections to these prior cells. Generally, when it is attempted to reduce the size of the cell to a minimum so that a large number of cells can be fabricated on a single chip along with other logic and memory functions, and also to specify the device for operation over a wide range of supply and clock voltage levels and a wide temperature range, then in some cases a stored ground level will not be properly reinforced.

SUMMARY OF THE INVENTION

It is the object of this invention to provide a memory cell or storage cell of the type implemented in semiconductor integrated circuits, particularly a cell which is of very small size so that a large number of cells can be provided in a small area of a semiconductor chip, and also a cell which will operate over wide ranges of supply voltage and temperature. Another object is to provide a cell of the type used in a random access memory which does not require periodic refreshing. It is an object of the invention to provide a "self-refreshing" or "invisible refresh" operation in a RAM cell. An additional object is to provice a self-refreshing MOS RAM cell which will positively and unambiguously reinforce a stored logic "1" or "0". Further, it is an object to provide an MOS RAM cell which is efficiently laid out or patterned in a semiconductor integrated circuit form. Another object is the provision of a RAM system which uses a minimum of clock voltages, and needs only a single address line for each column of cells and a single data line for each row of cells in the RAM array, and further requires a minimum of supporting circuitry external to the array of cells. It is another object to provide a RAM cell implemented in integrated circuit form which requires a minimum of contacts between semiconductor regions and overlying conductor regions, as such contacts are wasteful of area on a semiconductor chip; in this invention only one such contact is required per cell.

In accordance with an embodiment of the invention, a memory cell is provided that employs five MOS transistors. Three nodes are important at interconnections in the connection of the five transistors. First and second of the nodes store the bit as a voltage level. The source-drain path of one transistor is connected between a first source of reoccurring clock pulses and the third node, with the gate of this transistor being the second node. A second transistor has its source-drain path connected between the third node and the first node, with the gate of the second transistor also being driven by the first clock pulss. A third transistor connects the first node to the second node, with the gate of this transistor being driven by second clock pulses which are out of phase with the first clock pulses. The source-drain path of a fourth transistor is connected between the first node and a data buss, with the gate of this transistor being driven by an address line. The major capacitances are those existing at the first and second nodes. The third node is connected to the source of the first clock pulses by a fifth transistor which has its gate connected to the second clock pulses.

BRIEF DESCRIPTION OF THE DRAWINGS

The novel features believed characteristic of the invention are set forth in the appended claims. The invention itself, however, will be best understood by reference to the detailed description which follows, read in conjunction with the accompanying drawings, wherein:

FIG. 3b is an elevation view in section of part of the cell of FIG. 3a, taken along the line b—b in FIG. 3a;

FIG. 3c is an elevation view in section of part of the cell of FIG. 3a, taken along the line c—c in FIG. 3a;

FIG. 3 d is an elevation view in section of part of the cell of FIG. 3a, taken along the line d—d in FIG. 3a;

Referring to FIG. 1, a memory cell according to the invention is illustrated. The cell includes four MOS transistors Q1, Q2, Q3, Q4 and Q5 of the P-channel type. The source-drain paths of transistors Q1 and Q2 are connected in series between a $\phi1$ line 10 and a node A. The source-drain paths of Q3 and Q4 are connected in series between a data I/O line 11 and the gate of Q1 which is storage node B. The gate of Q2 is driven from a $\phi1$ line 12, and the gate of Q3 is driven from a $\phi5$ line 13. Transistor Q4 is turned on only when addressed from an address line 14. The voltage-time sequences of $\phi1$ and $\phi5$ are shown in FIG. 2, with the repetition rate being about 80 KHz or less. Generally, a negative voltage ($-V_{DD}$) is a logic "0" and a more positive voltage (usually ground or $V_{SS}$) is a logic "1", although these are interchangeable. When the cell of FIG. 1 is addressed by a "o" or $-V_{DD}$ negative voltage on the address line 14, a voltage on the I/O line 11 may charge the capacitance of node A. Thus, if the I/O line 11 is at $-V_{DD}$ or "o", the node A will go to a negative voltage; if the I/O line 11 is at $V_{SS}$ or "1", the node A will discharge to or stay at this $V_{SS}$ level. Assuming that "Address" and "I/O" subsist on lines 11 and 14 during $\phi5$, then Q3 will turn on and the gate of Q1 or the capacitance of a node B will charge (or discharge) toward the same level as the I/O line. It is thus seen that by proper timed actuation of the address line 14 and data I/O line 11, along with transistor Q5, the nodes A and B are definitively charged or discharged to the level of the I/O line 11. However, it is the self-refresh operation during periods that the cell is not addressed which is most important to the invention.

If a logic "0" is stored, node B is at a negative voltage. When $\phi1$ goes negative, transistor Q1 turns on, as well as transistor Q2, so node A will charge to the negative voltage of the $\phi1$ source minus the $V_T$ drop across Q2. Thus, it is assured that node A will be at a full logic "0" level whenever a logic "0" level is at node "B". When $\phi1$ goes to ground, node C discharges briefly through Q1 which momentary conducts, but basically C will be discharged to ground through Q5 to the $\phi1$ source which is now at ground, when the gate of Q5 goes to $-V$ from $\phi5$. During $\phi5$, it can be shown that node A is slightly more negative than node B, so charge will flow through Q3 from node A to node B, reinforcing a "0" or $-V$ stored on node B. For each sequence of $\phi1$, $\phi5$ clock pulses, node B will be driven toward or held at a full logic "0".

If a logic "1" is stored, node B will be at or near ground. When $\phi1$ goes negative, Q1 will not turn on because the voltage on its gate is below threshold. Node C was at ground because of the action of Q5 during the previous $\phi5$. Node A will not be charged via the Q1-C-Q2 path from $\phi1$, even though Q2 is on.

Thus, either a "1" or a "0" is reinforced; the cell is bidirectionally self-refreshing. Upon read-out or recall, the I/O line 11 is assumed to be "precharged" or preset to ground or $V_{SS}$, and the address line 14 is assumed to be negative during $\phi1$. If a "0" is stored on the capacitance of node B, Q1 will e turned on, as will Q2 and Q4, so the I/O line will be driven toward $-V_{DD}$ from the $\phi1$ line through Q1, Q2 and Q4, while the node A will be reinforced, i.e., the read-out is nondestructive. If a "1" had been stored, Q1 would be turned off, so $\phi1$ would not be connected through Q1, etc. to the I/O line, node A would be at about $V_{SS}$, so when Q4 turns on no charge would be transferred and both the I/O line and node A would remain at $V_{SS}$.

Figure 1:
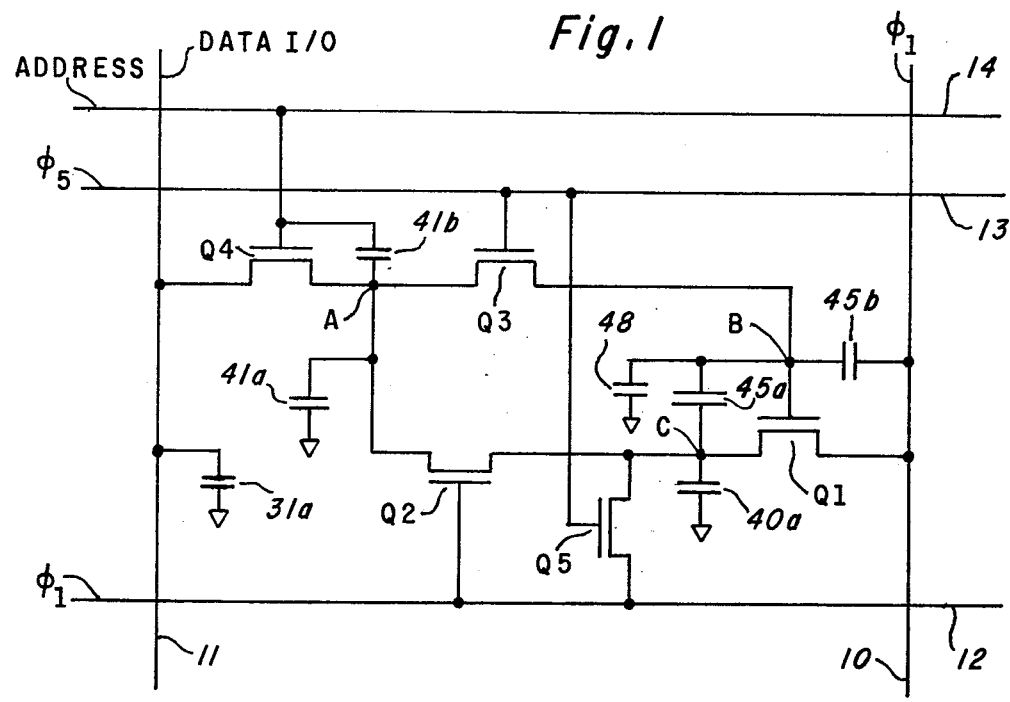
FIG. 1 is an electrical circuit diagram in schematic form of a memory cell according to the invention.
Figure 2:
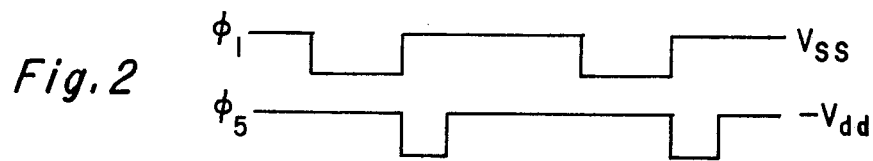
FIG. 2 is a graph of voltage vs. time for clock pulses used in the circuit of FIG. 1.

Referring to FIGS. 3a–3d, a simplified layout of a memory cell of FIG. 1 on an N-type semiconductor chip 30 is illustrated. The cell includes two P-diffusion strips 31 and 32 which form the I/O line 11 and the $\phi1$ line 10, and further includes three metal strips 33, 34 and 35 overlying thick field oxide 36 to form the address line 14, the other $\phi1$ line 12, and the $\phi5$ line 13, respectively. The gates of transistors Q4, Q2, Q3 and Q5 are formed beneath the metal strips 33, 34, 35 by thin oxide regions 37, 38, 39a, respectively, which are indicated by dotted lines on FIG. 3a. An irregularly shaped P-diffused region 40 forms the drain of Q1 and the sources of Q2 and Q5, and also defines the capacitance of node C, while a relatively large P-diffused region 41 forms the drain of Q2, the source of Q4 and the source of Q3; the region 41 defines the node A, forming a P-N junction capacitance with the substrate 30 which is labeled a capacitor 41a in FIG. 1 and a thin oxide capacitor to the line 33 labeled 41b. Another P-diffused region 43 forms the drain of Q3 and an area to which a contact 44 is made by a large metal area 45 that also forms the gate of Q1 and one plate of a large capacitance of node B which is labeled as a capacitor 45a in FIG. 1. A thin oxide area 47 shown by dotted lines defines the gate insulator for Q1 and also the dielectric of the capacitor 45a. A capacitance exists between node B and the substrate, principally formed by the P-diffused region 43; this capacitance is labeled as a capacitor 48 in FIG. 1. The capacitor 48 is a capacitance in the circuit which is detrimental to operation, so it is made as small as practical. Another capacitance exists between the P-diffused region 40 or node C and the substrate 30, and this is labeled as a capacitor 40a in FIG. 1; this capacitance 40a at the node C aids the circuit operation and so the region 40 is made larger than needed to merely connect Q1, Q2 and Q5. The region 40 also extends under the address line 33 in an area 49. A small capacitance 45b exists between the gate of transistor Q1 and the P-region 32, at an area 46 which extends under the metal 45 and forms the source of transistor Q1. This area 46 and the capacitor 45b is made as small as practical for the reason to be explained.

A capacitor 31a exists between the data I/O line 11 or P-region 31 and the substrate; this capacitor is very large compared to that of nodes A or B because of the layout of the memory array which necessitates region 31 extending for the width of the array.

The operation of the cell of FIGS. 1 and 3a–3d will be considered in more detail. For a $-V$ or logic zero stored on node B, when $\phi1$ goes from ground to $-V_{DD}$, node B will go from its initial $-V$ to a slightly more negative value due to coupling through capacitor 45b from the $\phi1$ line to the gate of transistor Q1. Further, as node C goes from ground toward the $-V_{DD}$ level of $\phi1$ as transistor Q1 becomes conductive, then node B goes even more negative because of the large capacitance 45a formed by the large thin oxide area between metal 45 and the P-region 40. This large negative voltage on node B causes the drop across Q1 to be essentially zero, so the node C goes all the way to $-V_{DD}$, and node A charges to a full $-(V_{DD} - V_T)$ value. When $\phi1$ goes to ground, B will be pulled down to about its original level by the capacitors 45a and 45b. When $\phi5$ goes negative, node C is discharged, but node A remains at $-(V_{DD} - V_T)$. Node B may be slightly more positive than node A, and charge will flow from node A to node B during $\phi5$, thus enhancing the negative level of node B. Now considering the operation when a logic "1" is stored, or node B is at about ground, it is significant to note the change in voltage at node B when clock $\phi1$ goes from zero to $-V_{DD}$. At this time, node B will go slightly negative due to the capacitor 45b. But, node B must not go negative enough to turn on the transistor Q1, so the capacitor 45b is made as small as possible. The voltage coupled to node B at this instant is a function of $$\frac{C(45b)}{C(45b) + C(45a) + C(48)} \qquad (1)$$

where C(45b) represents the value of capacitance 45b, etc. The capacitance 45b is made very small by making the region 46 very small, while the capacitance 45a is made very large by the large part of the P-diffused region 40 under the thin oxide area 47 and the metal 45. Thus, the expression (1) reduces to a very small value. In contrast, the coupling efficiency for the voltage coupled from node C back to node B when a logic "0" or −V is stored on node B (because transistor Q1 is on in this case) is represented by the expression $$\frac{C(45a)}{C(45a) + C(40a) + C(48) + C(45b)} \qquad (2)$$

Again, by making the capacitor 45a very large, the expression (2) becomes almost unity, which is desirable for a stored "0". Thus, the large value of capacitor 45a enhances circuit operation for refreshing both "1" and "0" levels.

Figure 3A:
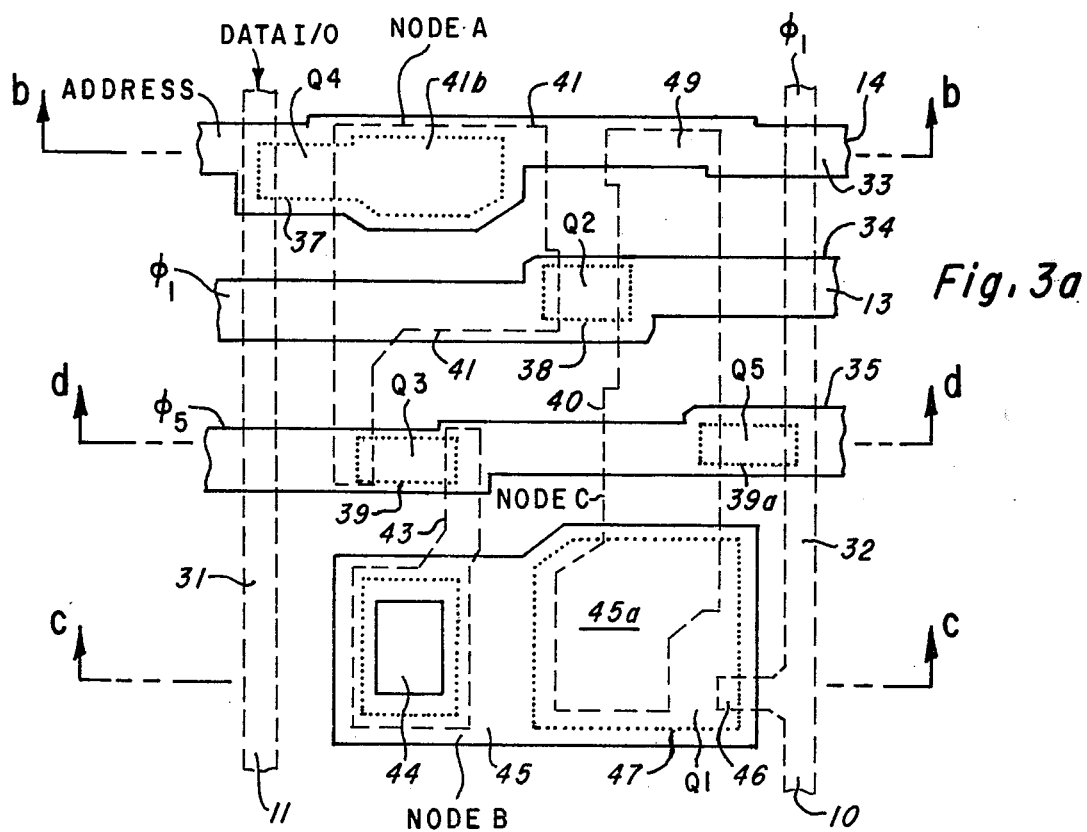
FIG. 3a is a plan view, greatly enlarged, of the cell of FIG. 1 in a form that it may be manufactured as a semiconductor integrated circuit.
Figure 3B:
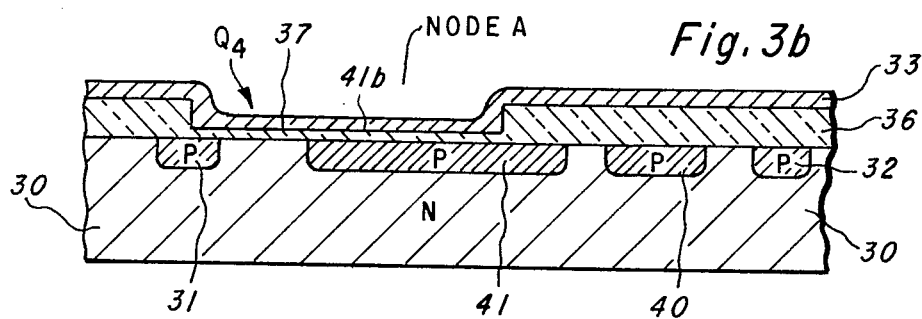
Figure 3C:
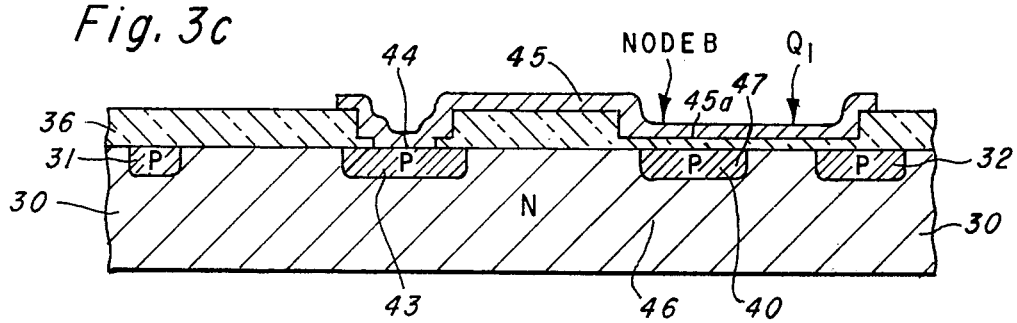
Figure 3D:
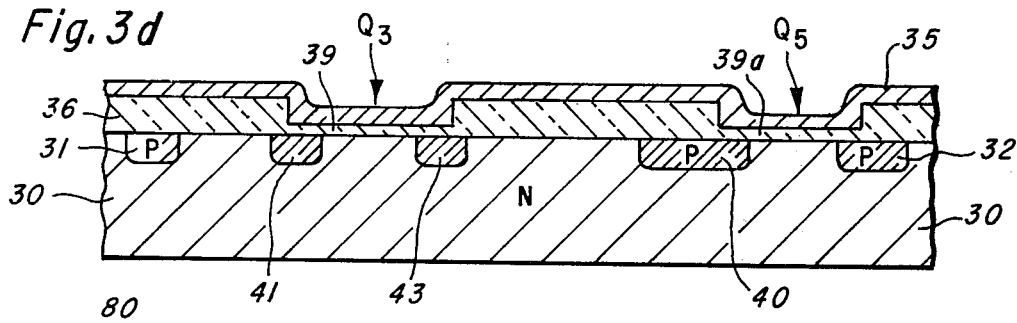

A large capacitor 41b is intentionally formed between the address line 14 and the node A. The address line 14 is at ground most of the time since a given cell is addressed only once out of dozens or hundreds of machine cycles, depending upon system programming. The line 14 can be considered a ground line, for the present purposes. The capacitance at node A is thus essentially C(41b) + C(41a). The capacitance 41a changes, depending upon whether a "1" or "0" is stored, since it is a P-N junction capacitor. It will be large when node A is at $V_{SS}$ because the depletion layer is very narrow, and much smaller when node A is at about $-V_{DD}$ because the depletion layer is wide. The capacitors 41a and 41b affect the ratio of voltages coupled onto nodes A and B by $\phi 5$. The gate-to-source and gate-to-drain capacitances for transistor Q3 are both small and about equal, as seen in the layout of FIG. 3a and in section of FIG. 3c. The value of the capacitance at node B is rather large and consists essentially of [C(45a) + C(45b) + C(48)]; this remains about constant. It is desired that the ratio of the magnitudes of the node A and B capacitances switch for "1" or "0" stored, so that the effect of $\phi 5$ will enhance a "1" or "0". The value of the capacitance of node A must be brought up to about the level of that of node B, and this is the function of the capacitor 41b; then capacitor 41a will switch the magnitude above and below that of node B.

Reading out of the cell is accomplished merely by making the address line 14 negative during $\phi 1$. Writing into the cell is accomplished by making the address line 14 negative during $\phi 5$. Of course, there are many, for example sixteen, cells on the buss 11 and only one at a time may be unambiguously addressed, so at all other times (fifteen memory cycles out of sixteen on the average in the example) the cell does not access the buss 11.

Figure 4:
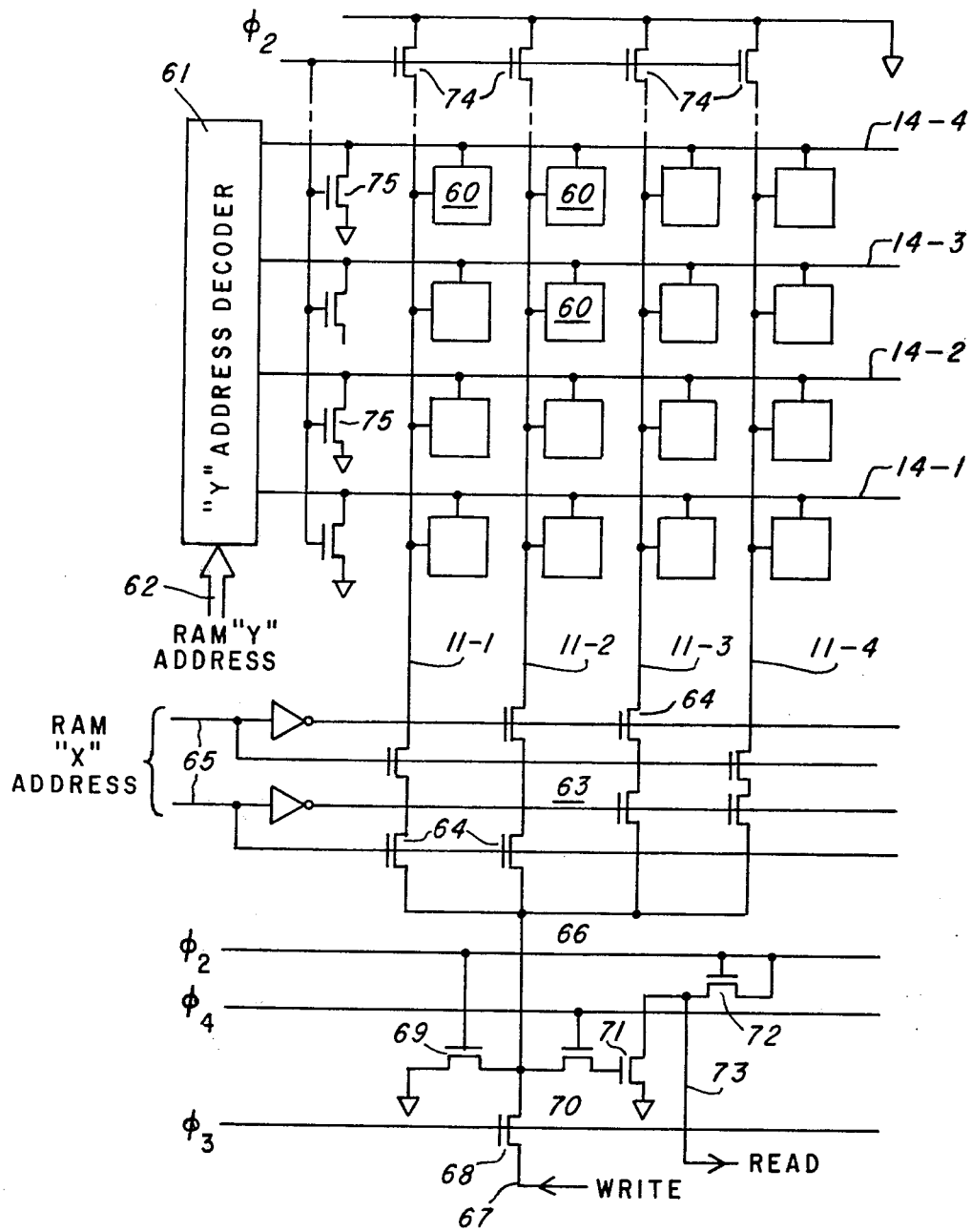
FIG. 4 is an electrical circuit diagram in schematic form of a memory array using the cells of FIG. 1.

Referring to FIG. 4, a random access memory is shown according to the invention. The array comprises a large number of cells 60, each of which is of the type described above with reference to FIGS. 1 and 3a–3d. A four-by-four array of cells 60 is shown, but it is of course understood that a much larger array would be used. For example, in a chip for a hand-held calculator, an array as in FIG. 5 would be perhaps sixteen-by-sixteen, organized in four-bit or BCD format. An address line 14 is provided for each row, labeled 14–1 to 14–4. The two $\phi 1$ lines and the $\phi 5$ line are not shown in the array, but would be present just as in FIGS. 1 and 3a–3d. One of the address lines 14 is selected by a "Y" address decoder 61, which receives an encoded address at an input 62. This Y address subsists during $\overline{\phi}2$ as will be seen in FIG. 5. For a 16 × 16 array, there would be sixteen of the lines 14, and the input 62 would be a four-bit code. The lines 11 are selected by an X decoder 63 which comprises a combination of transistors 64. One of the four lines 11–1 to 11–4 is selected according to an address on lines 65; if a code "01" exists on lines 65, the line 11–4 would be selected; a code "11" would select line 11–1, etc. Thus, an I/O line 66 would be connected to only one of the lines 11, depending upon the code on input 65. Of course, a similar decoder 63 would be provided for each group of four of the lines 11 in the above example, or if the RAM is organized differently then another appropriate decoder would be used.

Figure 5:
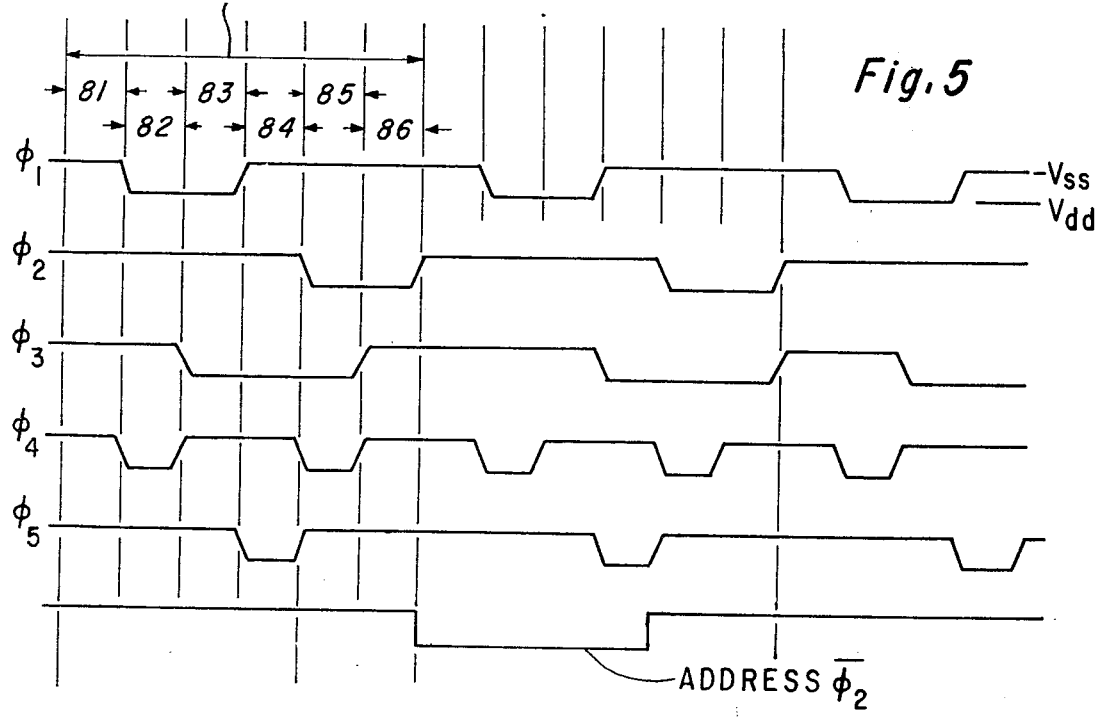
FIG. 5 is a graph of voltage vs. time for clock pulses used in the system of FIG. 5.

A timing diagram for clock voltages in the system of FIG. 4 is shown in FIG. 5. This clock sequence is the same as used for the remainder of the calculator chip mentioned above. The basic machine cycle is an interval 80 made up of six intervals 81–86 each of which is nominally 2 or more microseconds in length, so the interval 80 or machine cycle time is 12 microseconds or more. The phase $\phi 1$ exists during intervals 82 and 83, $\phi 2$ during 85 and 86, $\phi 3$ during 83, 84 and 85, $\phi 4$ during 82 and 85, and $\phi 5$ during interval 84, as seen in the drawing. As noted above, only $\phi 1$ and $\phi 5$ are needed in the cells per se.

Input/output circuitry connected to the line 66 includes a Write input line 67 connected through a device 68 clocked on $\phi 3$, so that data reaches the line 66 during the important interval, $\phi 5$, when it must exist on the selected line 11. Phase $\phi 3$ is wider than needed, but exists for other purposes in the system. The line 66 is shorted to $V_{SS}$ during $\phi 2$ by a device 69 which is clocked on $\phi 2$. Data is read out of a cell 60 during $\phi 1$, onto lines 11, and so will exist on line 66 at this time. For read out, the data goes through a device 70 which is clocked during $\phi 1$ by $\phi 4$, to the gate of a transistor 71. During the preceeding $\phi 2$, transistor 72 was turned on and charged on an output line 73. The output line is conditionally discharged by the transistor 71, depending on the data on its gate. The bit on the gate of device 71 will be shorted to $V_{SS}$ through devices 69 and 70 during the interval 85 of $\phi 4$, when $\phi 2$ is also on. Thus the output on line 73 is valid starting at interval 82 and ending as interval 85 begins.

The I/O lines 11 are shorted to $V_{SS}$ during $\phi 2$ by devices 74 on intervals 85 and 86, since it is necessary for the lines to be at $V_{SS}$ before read out which occurs during interval 82 of the next cycle. The address lines 14 should be at $V_{SS}$ at all times (except during $\phi 2$ for the selected line), so devices 75 are shown for this purpose, although this function could be part of the address decoder 61.

The circuitry of devices 68–73 would be repeated for each of the four groups of cells or "pages" of the RAM, in the calculator chip previously mentioned.

The cell of the invention is shown herein as being made up of P-channel MOS transistors; however, N-channel devices may be used instead. The term "MOS"

is meant to include not only traditional "metal-oxide-semiconductor" devices but also silicon gate devices and field effect transistors which use nitride, or oxide and nitride, as the gate insulator. That is, the term MOS transistor is synonymous with insulated gate field effect transistor.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. Storage means comprising a first node having capacitance, a second node having capacitance, a third node, an intermittent voltage source, first switching means connecting the voltage source to the third node, second switching means connecting the third node to the first node, the first switching means being controlled by the voltage on the second node, the second switching means being controlled by first recurring clock pulses, a third switching means connecting the first node to the second node, a fourth switching means connecting the third node to a reference potential, the third and fourth switching means being conrolled by second recurring clock pulses out of phase with the first clock pulses.

2. Storage means according to claim 1 wherein the first node is connected to means for writing in and reading out data.

3. Storage means according to claim 2 wherein the first node is connected to the means for writing in and reading out data via a fifth switching means which is controlled by an address signal.

4. Storage means accoding to claim 1 wherein the first and second recurring clock pulses are non-overlapping.

5. Storage means according to claim 4 wherein a source is provided for the intermittent voltage source which is the same as the first source of recurring clock signals, and said reference potential is provided by said source.

6. Storage means according to claim 5 wherein the first node is connected to means for writing in and reading out logic levels via a fifth switching means which is controlled by an address signal.

7. Storage means according to claim 6 wherein the address signal subsists during the first recurring clock signals for reading out and during the second recurring clock signals for writing in.

8. Storage means according to claim 7 wherein the switching means are insulated gated field effect transistors.

9. Storage means according to claim 1 wherein the switching means are MOS transistors formed in a monolithic semiconductor device with said nodes.

10. A memory cell comprising first and second sources of recurring clock signals; first, second and third nodes; a first field effect transistor having a current path connected between a voltage supply and the third node; a second field effect transistor having a current path connected between the third node and the first node, the gate of the second field effect transistor being connected to the first source of clock pulses; a third field effect transistor being connected between the first and second nodes, the gate of the third transistor being connected to the second source of clock signals; a fourth field effect transistor having a current path connected between the third node and the first source of clock signals, the gate of the fourth transistor being connected to the second source of clock signals; and means for reading out and writing in logic levels to the first node.

11. A memory cell according to claim 10 wherein said voltage supply is the first source of clock signals.

12. A memory cell according to claim 11 wherein a thin oxide MOS capacitor is provided between the source of said address signals and the first node.

13. A memory cell according to claim 11 wherein the means for reading out and writing in comprises a fifth field effect transistor having a current path connected between the first node and a source of data.

14. A memory cell according to claim 13 wherein the gate of the fifth field effect transistor is driven by address signals which are on during the first clock signals for reading out and on during the second clock signals for writing in.

15. A memory cell according to claim 14 wherein capacitance exists between the second node and the third node.

16. A memory cell according to claim 15 wherein said capacitance includes a thin oxide MOS capacitor much larger than the gate of the first transistor.

17. A memory cell according to claim 15 wherein said capacitance is much larger in value than the total of other capacitances existing at said third node.

18. A self-refreshing memory cell for a random access memory system comprising: a plurality of switching means each having a current path and a control means for controlling current through the current path; means providing sources of first and second periodic clock pulses with the second following the first; first, second and third nodes; first and second of the switching means having current paths connected in series between the source of the first clock pulses and the first node; capacitance means provided between the control means of the first switching means and the third node, the third node being at the intersection in the current paths of the first and second switching means; the control means of the second switching means being connected to the source of the first clock pulses; a third one of the switching means having its current path connected between the first node and the second node and having its control means connected to the source of the second clock pulses; a fourth of the switching means having its current path connected between the third node and the source of the first clock pulses and having its control means connected to the source of the second clock pulses; and a fifth of the switching means having its current path connected between the first node and a data source and having its control means connected to an address signal source.

19. A memory cell according to claim 18 wherein the switching means are insulated gate field effect transistors and the control means are the gate electrodes of the insulated gate field effect transistors.

20. A memory cell according to claim 19 wherein the first and second clock pulses are non-overlapping.

21. A memory cell according to claim 20 wherein a capacitance is provided between the gate of the first switch means and the third node by a thin oxide capacitor which is large compared to the gate of the first switching means.

22. A memory cell according to claim 21 wherein the cell reinforces a logic one or logic zero stored on the first and second nodes.

23. A memory cell according to claim 22 wherein a large thin oxide capacitor is provided between the address signal source and the first node, such capacitor being larger than the gate of the fifth switching means.

* * * * *